United States Patent
Adachi et al.

(10) Patent No.: US 8,581,296 B2
(45) Date of Patent: Nov. 12, 2013

(54) COMPOUND SEMICONDUCTOR DEVICE

(75) Inventors: Masahiro Adachi, Osaka (JP); Shinji Tokuyama, Osaka (JP); Koji Katayama, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 72 days.

(21) Appl. No.: 12/835,003

(22) Filed: Jul. 13, 2010

(65) Prior Publication Data

US 2011/0108853 A1 May 12, 2011

(30) Foreign Application Priority Data

Nov. 11, 2009 (JP) .................................. 2009-258215

(51) Int. Cl.
*H01L 33/00* (2010.01)

(52) U.S. Cl.
USPC .................. 257/103; 257/90; 257/85; 257/76

(58) Field of Classification Search
USPC ............................................. 257/77, 79–103
See application file for complete search history.

(56) References Cited

U.S. PATENT DOCUMENTS

| | | | |
|---|---|---|---|
| 8,110,482 B2 | 2/2012 | Kaeding et al. | |
| 8,124,991 B2 * | 2/2012 | Iso et al. | 257/98 |
| 2003/0143772 A1 * | 7/2003 | Chen | 438/47 |
| 2008/0185608 A1 * | 8/2008 | Chitnis | 257/99 |
| 2008/0232416 A1 * | 9/2008 | Okamoto et al. | 372/45.01 |
| 2009/0039367 A1 | 2/2009 | Iso et al. | |

(Continued)

FOREIGN PATENT DOCUMENTS

| | | |
|---|---|---|
| JP | 2004-172568 | 6/2004 |
| JP | 2005-129696 | 5/2005 |

(Continued)

OTHER PUBLICATIONS

N. J. Watkins, G. W. Wicks, Oxidation study of GaN using x-ray photoemission spectroscopy, Oct. 1999, Applied Physics Letters, vol. 75, No. 17, pp. 2602-2604.*

(Continued)

*Primary Examiner* — Steven Loke
*Assistant Examiner* — Cuong B Nguyen
(74) *Attorney, Agent, or Firm* — Drinker Biddle & Reath LLP

(57) ABSTRACT

A compound semiconductor device having reduced contact resistance to an electrode is provided. The compound semiconductor device includes an n-substrate 3 comprising a hexagonal compound semiconductor GaN and having surfaces S1 and S2; an n-electrode 13 formed on the surface S1 of the n-substrate 3; a layered product having an n-cladding layer 5, an active layer 7, a p-cladding layer 9, and a contact layer 11 formed on the surface S2 of the n-substrate 3; and a p-electrode 15 formed on the p-cladding layer 9. The number of N atoms contained on the surface S1 of the n-substrate 3 is more than the number of Ga atoms contained on the surface S1. The electrode formed on the surface S1 is an n-electrode 13. The surface S1 has an oxygen concentration of not more than 5 atomic percent. The number of Ga atoms contained on the surface S3 of the contact layer 11 is more than the number of N atoms contained on the surface S3. The electrode formed on the surface S3 is a p-electrode 15. The surface S3 has an oxygen concentration of not more than 5 atomic percent.

5 Claims, 2 Drawing Sheets

(56) References Cited

U.S. PATENT DOCUMENTS

2009/0085043 A1* 4/2009 Song et al. .................. 257/76
2010/0275837 A1* 11/2010 Hashimoto et al. ........... 117/101
2012/0119218 A1 5/2012 Su

FOREIGN PATENT DOCUMENTS

| JP | 2005191530 A | 7/2005 |
|----|--------------|--------|
| JP | 2006-339605 A | 12/2006 |
| JP | 2007-116076 | 5/2007 |
| JP | 2007129252 A | 5/2007 |
| JP | 2008010835 A | 1/2008 |
| JP | 4333820 | 9/2009 |
| WO | 2006/098215 AI | 9/2006 |

OTHER PUBLICATIONS

M. Sumiya, K. Yoshimura, T. Ito, K. Ohtsuka, S. Fuke, Growth mode and surface morphology of a GaN film deposited along the N-face polar direction on c-plane sapphire substrate, Jul. 15, 2000, Journal of Applied Physics, vol. 88, No. 2, p. 1158-1165.*

Takashi Kyono et al., Optical Polarization Characteristics of InGaN Quantum Wells for Green Laser Diodes on Semi-Polar {2021} GaN Substrates, Applied Physics Express 3 (2010) 011003, The Japan Society of Applied Physics, Jan. 8, 2010, p. 011003-1-p. 011003-3.

Masaki Ueno et al., "InGaN-based true green laser diodes on novel semi-polar {2021} GaN substrates," Journal of Crystal Growth 315, Elsevier B.V., 2011, p. 258-p. 262.

* cited by examiner

COMPOUND SEMICONDUCTOR DEVICE

BACKGROUND OF THE INVENTION

1. Field of the Invention

The present invention relates to a compound semiconductor device.

2. Related Background Art

Patent Literature 1 (Japanese Patent Application Laid-open No. 2004-172568) discloses a nitride semiconductor device having a counter-electrode structure. An n-polar surface of this nitride semiconductor at least includes a tilting surface which is different from a surface (000-1), and is provided with an electrode. The n-polar surface of this nitride semiconductor has unevenness. Furthermore, the tilting surface differing from the surface (000-1) is located on a side of bump of unevenness, and has an off angle from the surface (000-1) in a range of not less than 0.2° and not more than 90°. Patent Literature 2 (Japanese Patent Application Laid-open No. 2005-129696) discloses a semiconductor device (HFET). The HFET has a first nitride semiconductor layer formed on a buffer layer on a SiC substrate; a second nitride semiconductor layer on the first nitride semiconductor layer, the second nitride semiconductor layer producing a two-dimensional electron gas layer in an upper part of the first nitride semiconductor layer; and two ohmic electrodes selectively formed on the second nitride semiconductor layer. The second nitride semiconductor layer includes a contact portion having a tilting portion of which the cross section shape is concave shape. The bottom surfaces or the side surfaces of the tilting portion tilt from the substrate surface. The two ohmic electrodes are formed on the contact portion.

Patent Literature 3 (Japanese Patent Application Laid-open No. 2007-116076) discloses a semiconductor device including an n-electrode having low contact resistance on a nitrogen polar surface of gallium nitride (GaN)-based semiconductor. The semiconductor device has a group-V atom vacancy region having a ratio (the number of group-III atoms)/(the number of group-V atoms) of more than 1 at a portion in contact with the n-electrode. Patent Literature 4 (International Publication No. WO2006/098215) discloses a nitride semiconductor device. The nitride semiconductor device has an n-type GaN substrate; a layered semiconductor structure which includes a p-type region and an n-type region and is formed on a principal surface of the n-type GaN substrate; a p-side electrode in contact with a part of the p-type region included in the layered semiconductor structure; and an n-side electrode provided on the backside of the n-type GaN substrate. In the nitride semiconductor device, the backside of the n-type GaN substrate includes a nitrogen surface, and a carbon concentration of the interface between the backside and the n-side electrode is adjusted within a range of not more than 5 atomic percent.

SUMMARY OF THE INVENTION

Patent Literatures 1 to 4 disclose structures of compound semiconductors having electrodes, as described above. Patent Literatures 1 to 4, however, does not disclose sufficiently reduced contact resistance of the electrodes by selection of conductivity type (n-type or p-type) of the electrodes. An object of the present invention, accomplished under such a situation, is to provide a compound semiconductor device having reduced contact resistance to an electrode.

A compound semiconductor device according to one aspect of the present invention comprises: a compound semiconductor layer comprising a hexagonal compound semiconductor and having a first surface and a second surface, the second surface being on the opposite side of the first surface; a first electrode being formed on the first surface of the compound semiconductor layer; a layered product having a plurality of semiconductor layers on the second surface of the compound semiconductor layer, the plurality of semiconductor layers being stacked; and a second electrode being formed on the layered product, the number of anionic atoms of the first surface being more than the number of cationic atoms of the first surface, the first electrode being an n-electrode, the first surface having an oxygen concentration of not more than 5 atomic percent, and the compound semiconductor layer comprising a group-III nitride semiconductor or SiC. The conductivity type of an electrode is selected in consideration of the number of the anionic atoms, the number of the cationic atoms, and the oxidation concentration of the surface of the compound semiconductor layer provided with the electrode. According to the present invention, the contact resistance between the first electrode and the compound semiconductor layer can be reduced by a surface on which the n-type first electrode is formed, the number of the anionic atoms is more than the number of the cationic atoms, and the number of vacancies of the anionic atoms is relatively large. The oxygen concentration of the surface provided with the first electrode is controlled to a lower level in order to further reduce the contact resistance between the first electrode and the compound semiconductor layer.

In this compound semiconductor device, preferably, the n-electrode comprises materials containing at least one element of Al, Ti, In, and Au elements; the fourth index k of the crystallographic plane indices (h, i, j, k) of the first surface is a negative integer; and the first surface is either {20-2-1} plane or {10-1-1} plane.

This compound semiconductor device comprises: a compound semiconductor layer comprising a hexagonal compound semiconductor and having a first surface and a second surface, the second surface being on the opposite side of the first surface; a first electrode being formed on the first surface of the compound semiconductor layer; a layered product having a plurality of semiconductor layers on the second surface of the compound semiconductor layer, the plurality of semiconductor layers being stacked; and a second electrode being formed on the layered product, the number of anionic atoms of the first surface being less than the number of cationic atoms of the first surface, the first electrode being an p-electrode, the first surface having an oxygen concentration of not more than 5 atomic percent, and the compound semiconductor layer comprising a group-III nitride semiconductor or SiC. The conductivity type of an electrode is selected in consideration of the number of the anionic atoms, the number of the cationic atoms, and the oxidation concentration of the surface of the compound semiconductor layer provided with the electrode. According to the present invention, the contact resistance between the first electrode and the compound semiconductor layer can be reduced by a surface on which the p-type first electrode is formed, the number of the cationic atoms is more than the number of the anionic atoms, and the number of vacancies of the cationic atoms is relatively large. The oxygen concentration of the surface provided with the first electrode is controlled to a lower level in order to further reduce the contact resistance between the first electrode and the compound semiconductor layer.

In this compound semiconductor device, preferably, the p-electrode comprises materials containing at least one element of Pd, Pt, Ni, Au, and W elements; the fourth index k of the crystallographic plane indices (h, i, j, k) of the first surface is a positive integer; the first surface is either {20-21} plane or {10-11} plane; and the layered product has an active layer.

DESCRIPTION OF THE PREFERRED EMBODIMENTS

Figure 1:
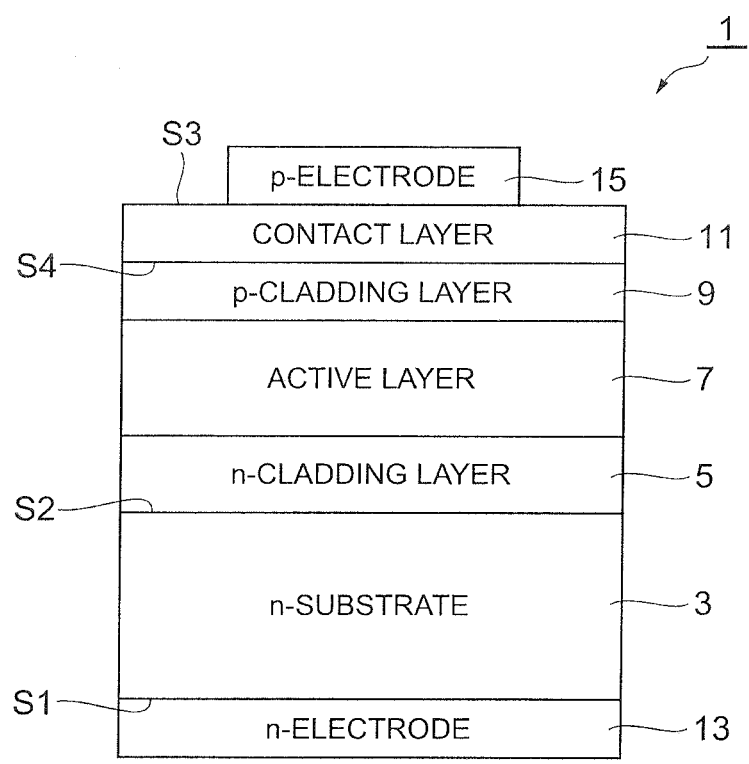
FIG. 1 is a drawing showing a configuration of a compound semiconductor device according to an embodiment of the present invention.

The preferred embodiments of the invention will be explained in reference to the attached drawings. The same reference numerals designate the same parts throughout the drawings, wherever possible, to curtail duplicate description. FIG. 1 is a drawing showing a configuration of a compound semiconductor device according to an embodiment of the present invention. A compound semiconductor device 1 shown in FIG. 1 is an LED. The compound semiconductor device 1 includes an n-substrate 3, an n-cladding layer 5, an active layer 7, a p-cladding layer 9, a contact layer 11, an n-electrode 13, and a p-electrode 15. The n-substrate 3 has a surface S1 and a surface S2 on the opposite side of the surface S1, and is composed of a hexagonal compound semiconductor GaN, or any other group-III nitride semiconductor such as GaAs, or SiC. On the surface S1 of the n-substrate 3, the number of anionic atoms is more than the number of cationic atoms. In the case where the number of the anionic atoms is lager, the number of vacancies of the anionic atoms is also larger. Since a vacancy of the anionic atom is considered to be equivalent to a donor, a donor concentration (cm$^{-2}$) of the surface S1 is also higher corresponding to the larger number of the vacancies of the anionic atoms. Since the n-substrate 3 is composed of GaN, the anionic atom corresponds to an N-atom while the cationic atom corresponds to a Ga-atom. Accordingly, since the number of the N-atoms is more than the number of the Ga-atoms on the surface S1, the number of vacancies of the N-atoms on the surface S1 increases. Since a vacancy of the N-atom is considered to be equivalent to a donor, the donor concentration (cm$^{-2}$) of the surface S1 is also higher corresponding to the larger number of the vacancies of the N-atoms. In the case where an electrode is formed on the surface S1 on which the number of the anionic atoms is more than the number of the cationic atoms, an n-electrode has lower contact resistance compared to a p-electrode, and consequently the ohmic nature is improved. As a result, the n-electrode 13 is formed on the surface S1 of the n-substrate 3.

An oxygen concentration of the surface S1 is not more than 5 atomic percent. A thickness of an oxide film on the surface S1 is not more than 50 angstrom. At a lower oxygen concentration of the surface S1 and a smaller thickness of the oxide film, the contact resistance to the n-electrode 13 is reduced. In the case where the number of the anionic atoms is more than the number of the cationic atoms on the surface S1, the fourth index k of the crystallographic plane indices (h, i, j, k) of the surface S1 is a negative integer (each of h, i, and j is an integer), such as (20-2-1), (11-2-2), (10-1-1), and (10-1-3). The surface S1 is preferably either {20-2-1} plane or {10-1-1} plane, in view of the symmetry property of the crystal lattice.

Figure 2:
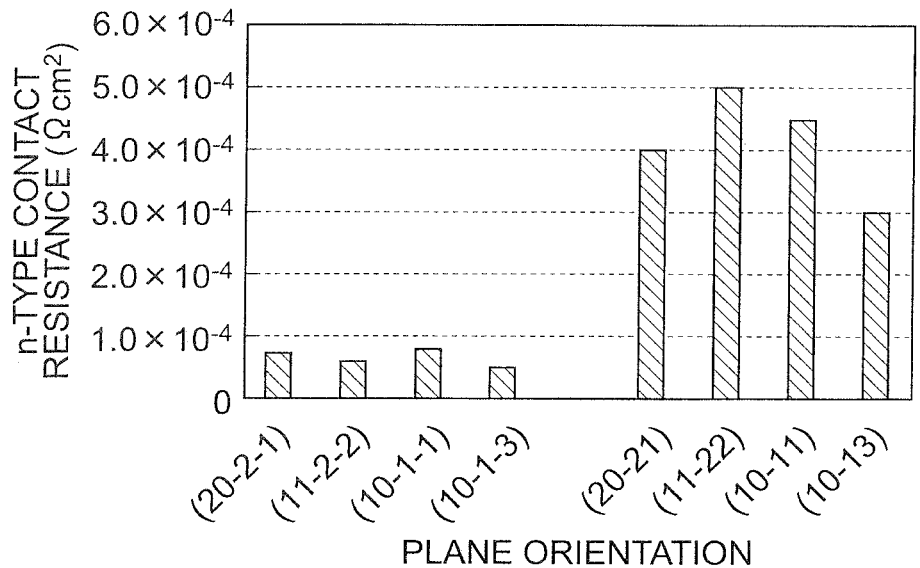
FIG. 2 is a drawing for explaining effects of the compound semiconductor device according to an embodiment of the present invention.
Figure 2:
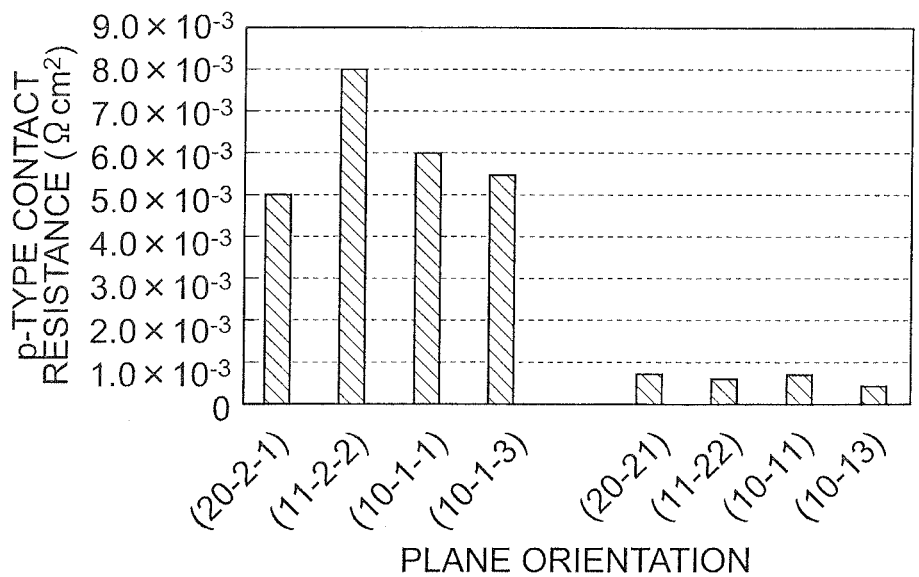

Part (A) of FIG. 2 shows measured value of the contact resistance of the n-electrode 13 formed on the surface S1 for every crystallographic plane index of the surface S1. As shown in Part (A) of FIG. 2, in the case where the fourth index k of the crystallographic plane indices (h, i, j, k) of the surface S1 is a negative integer such as (20-2-1), (11-2-2), (10-1-1), or (10-1-3), the n-electrode 13 has a contact resistance of not more than about $1.0 \times 10^{-4}$ Ωcm$^2$. In contrast, in the case where the fourth index k of the crystallographic plane indices (h, j, k) of the surface S1 is a positive integer such as (20-21), (11-22), (10-11), or (10-13), the n-electrode 13 has a contact resistance of not less than about $2.0 \times 10^{-4}$ Ωcm$^2$. It is apparent that a negative index k leads to a lower contact resistance of the n-electrode 13, compared to a positive index k.

On a surface of either a group-III nitride semiconductor other than GaN (for example, GaAs, or the like) or a semiconductor composed of SiC, as well as the surface S1 of the n-substrate 3 composed of GaN, the number of the vacancies of the anionic atoms increases, when the number of the anionic atoms is more than the number of the cationic atoms. And thus, an n-electrode has lower contact resistance compared to a p-electrode, and consequently the ohmic nature is improved. The fourth index k of the crystallographic plane indices (h, i, j, k) of such a surface is a negative integer, such as (20-2-1), (11-2-2), (10-1-1), or (10-1-3).

With reference to FIG. 1 again, a layered product composed of the n-cladding layer 5, the active layer 7, the p-cladding layer 9, and the contact layer 11 is provided on the surface S2 of the n-substrate 3. The n-cladding layer 5, the active layer 7, the p-cladding layer 9, and the contact layer 11 are sequentially stacked on the n-substrate 3. The n-cladding layer 5 is composed of n-type InGaN. The active layer 7 includes one or more barrier layers and one or more well layers. The barrier layer is composed of, for example, GaN, and the well layer is composed of, for example, InGaN. The p-cladding layer 9 is composed of p-type AlGaN, and the contact layer 11 is composed of p-type GaN.

The contact layer 11 has a surface S3 located on the opposite side of the interface (a surface S4 of the contact layer 11) to the p-cladding layer 9. The p-electrode 15 is formed on the surface S3. A layered product composed of the p-cladding layer 9, the active layer 7, the n-cladding layer 5, and the n-substrate 3 is formed on the surface S4 of the contact layer 11. On the surface S3 of the contact layer 11, the number of the cationic atoms is more than the number of the anionic atoms, on the contrary to the surface S1 of the n-substrate 3. In the case where the number of the cationic atoms is larger, the number of vacancies of the cationic atoms is also larger. Since a vacancy of the cationic atom is considered to be equivalent to an acceptor, an acceptor concentration (cm$^{-2}$) of the surface S3 is also higher corresponding to the larger number of the vacancies of the cationic atoms. Since the contact layer 11 is composed of GaN, the anionic atom corresponds to an N-atom while the cationic atom corresponds to a Ga-atom. Accordingly, since the number of the Ga-atoms is more than the number of the N-atoms on the surface S3, the number of vacancies of the Ga-atoms on the surface S3 increases. Since a vacancy of the Ga-atom is considered to be equivalent to an acceptor, the acceptor concentration (cm$^{-2}$) of the surface S3 is also higher corresponding to the lager number of the vacancies of the Ga-atoms. In the case where an electrode is formed on the surface S3 on which the number of the cationic atoms is more than the number of the anionic atoms, a p-electrode has lower contact resistance compared to an n-electrode, and consequently the ohmic nature is improved. As a result, the p-electrode 15 is formed on the surface S3 of the contact layer 11. In the case where the number of the cationic atoms is more than the number of the anionic atoms on the surface S3, the fourth index k of the crystallographic plane indices (h, j, k) of the surface S3 is a positive integer (each of h, i, and j is an integer), such as (20-21), (11-22), (10-11), or (10-13). The surface S3 is preferably either {20-21} plane or {10-11} plane, in view of the symmetry property of the crystal lattice.

An oxygen concentration of the surface S3 is not more than 5 atomic percent. A thickness of an oxide film on the surface S3 is not more than 50 angstrom. At a lower oxygen concentration of the surface S3 and a smaller thickness of the oxide film, the contact resistance to the p-electrode 15 is reduced.

Part (B) of FIG. 2 shows measured values of the contact resistance of the p-electrode 15 formed on the surface S3 for every crystallographic plane index of the surface S3. The measured values shown in Part (B) of FIG. 2 are obtained by measuring the contact layer 11 composed of GaN. As shown in Part (B) of FIG. 2, in the case where the fourth index k of the crystallographic plane indices (h, I, j, k) of the surface S3 is a positive integer, such as (20-21), (11-22), (10-11), or (10-13), the p-electrode 15 has a contact resistance of not more than about $1.0 \times 10^{-3} \Omega$ cm$^2$. In contrast, in the case where the fourth index k of the crystallographic plane indices (h, i, j, k) of the surface S3 is an negative integer, such as (20-2-1), (11-2-2), (10-1-1), or (10-1-3), the p-electrode 15 has a contact resistance of not less than about $4.0 \times 10^{-3}$ cm$^2$. It is apparent that a positive index k leads to a lower contact resistance of the p-electrode 15, compared to a negative index k.

On a surface of either a group-III nitride semiconductor other than GaN (for example, GaAs, or the like) or a semiconductor composed of SiC, as well as the surface S3 of the contact layer 11 composed of GaN, the number of the vacancies of the cationic atoms increases, when the number of the cationic atoms is more than the number of the anionic atoms. And thus, a p-electrode has lower contact resistance compared to an n-electrode, and consequently the ohmic nature is improved. The fourth index k of the crystallographic plane indices (h, i, j, k) of such a surface is a positive integer, such as (20-21), (11-22), (10-11), or (10-13).

With reference to FIG. 1 again, the n-electrode 13 is formed on the surface S1 of the n-substrate 3, and is in contact with the surface S1. The n-electrode 13 comprises materials containing at least one element of Al, Ti, In, and Au elements. The n-electrode 13 comprises preferably materials containing Al and Au elements, for example. The p-electrode 15 is formed on the surface S3 of the contact layer 11, and is in contact with the surface S3. The p-electrode 15 comprises materials containing at least one element of Pd, Pt, Ni, Au, and W elements. The p-electrode 15 comprises preferably materials containing Pd and Au elements, or materials containing Pt and Au elements, for example.

A method of fabricating the compound semiconductor device 1 will be described below. First, an n-substrate 3 is prepared. Next, an n-cladding layer 5, an active layer 7, a p-cladding layer 9, and then a contact layer 11 are epitaxially grown on the n-substrate 3. Subsequently, a p-electrode 15 is formed on a surface S3 of the contact layer 11, and an n-electrode 13 is formed on a surface S1 of the n-substrate 3. The n-electrode 13 is formed by vapor deposition of Al with an electron beam vapor deposition system and subsequent vapor deposition of Au with a resistive heating vapor deposition system. The p-electrode 15 is formed by vapor deposition of Pd or Pt with an electron beam vapor deposition system and subsequent vapor deposition of Au with a resistive heating vapor deposition system. Before the formation of the n-electrode 13 and the p-electrode 15, surface-treatments of the surface S1 of the n-substrate 3 and the surface S3 of the contact layer 11 are carried out in order to remove the oxide films formed on the surfaces S1 and S3. The surface S1 is cleaned with an organic cleaner of acetone and isopropyl alcohol, and is subsequently surface-treated with mixed liquid of sulfuric acid and hydrogen peroxide solution, hydrofluoric acid, aqua regia, or hydrochloric acid, followed by vapor deposition of Al and Au for forming the n-electrode 13. The surface S3 is cleaned with an organic cleaner of acetone and isopropyl alcohol, and is subsequently surface-treated with mixed liquid of sulfuric acid and hydrogen peroxide solution, hydrofluoric acid, aqua regia, or hydrochloric acid, followed by vapor deposition of Pd and Au or by vapor deposition of Pt and Au, for forming the p-electrode 15.

As described above, the embodiment of the present invention can provide a compound semiconductor device having reduced contact resistance to an electrode.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims. Specifically, the structure comprising a semiconductor layer (e.g., n-substrate 3) of a hexagonal compound semiconductor and the n-type electrode (e.g., n-electrode 13) provided on a surface of this semiconductor layer having larger numbers of the anionic atoms (i.e. a surface having large numbers of the vacancies of the anionic atoms, or a surface on which the forth index k of the crystallographic plane indices (h, i, j, k) is a negative integer, for example, surface S1) can be applied to other devices such as LDs, Schottky diodes, transistors, and HEMTs, while the structure comprising a semiconductor layer (e.g., contact layer 11) of a hexagonal compound semiconductor and the p-type electrode (e.g., p-electrode 15) provided on a surface of this semiconductor layer having larger numbers of the cationic atoms (i.e., a surface having large numbers of the vacancies of the cationic atoms, or a surface on which the forth index k of the crystallographic plane indices (h, i, j, k) is a positive integer, for example, surface S3) can be applied to other devices such as LDs, Schottky diodes, transistors, and HEMTs.

What is claimed is:

1. A compound semiconductor device comprising:
a compound semiconductor layer comprising a hexagonal compound semiconductor and having a first surface and a second surface, the second surface being on the opposite side of the first surface;
a first electrode being formed on the first surface of the compound semiconductor layer;
a layered product having a plurality of semiconductor layers on the second surface of the compound semiconductor layer, the plurality of semiconductor layers being stacked; and
a second electrode being formed on the layered product,
a number of anionic atoms of the first surface being more than a number of cationic atoms of the first surface,
the first electrode being an n-electrode,
the first surface having an oxygen concentration of not more than 5 atomic percent,
the compound semiconductor layer comprising a group-III nitride semiconductor or SiC,
and the first surface being {20-2-1} plane.

2. The compound semiconductor device according to claim 1, wherein the n-electrode comprises materials containing at least one element of Al, Ti, In, and Au elements.

3. A compound semiconductor device comprising:
a compound semiconductor layer comprising a hexagonal compound semiconductor and having a first surface and a second surface, the second surface being on the opposite side of the first surface;

a first electrode being formed on the first surface of the compound semiconductor layer;

a layered product having a plurality of semiconductor layers on the second surface of the compound semiconductor layer, the plurality of semiconductor layers being stacked; and a second electrode being formed on the layered product, a number of anionic atoms of the first surface being less than a number of cationic atoms of the first surface, the first electrode being an p-electrode, the first surface having an oxygen concentration of not more than 5 atomic percent, the compound semiconductor layer comprising a group-III nitride semiconductor or SiC, and the first surface being {20-21} plane.

4. The compound semiconductor device according to claim 3, wherein the p-electrode comprises materials containing at least one element of Pd, Pt, Ni, Au, and W elements.

5. The compound semiconductor device according to claim 1, wherein the layered product has an active layer.

* * * * *